United States Patent [19]
Chethik

[11] Patent Number: 5,783,977
[45] Date of Patent: Jul. 21, 1998

[54] TUNABLE AND BANDWIDTH PROGRAMMABLE MULTI-ELEMENT FILTER SYSTEM

[75] Inventor: Frank Chethik, Palo Alto, Calif.

[73] Assignee: Loral Aerospace Corporation, New York, N.Y.

[21] Appl. No.: 597,844

[22] Filed: Feb. 7, 1996

[51] Int. Cl.$^6$ .................................................. H03H 7/01
[52] U.S. Cl. ........................ 333/174; 333/139; 324/616
[58] Field of Search ................................. 333/17.1, 139, 333/167, 156, 174; 455/125, 266, 340; 324/616

[56] References Cited

U.S. PATENT DOCUMENTS

| | | | |
|---|---|---|---|
| 3,600,675 | 8/1971 | Greenier | 324/616 X |
| 3,781,722 | 12/1973 | Pierson | 333/156 |
| 4,301,454 | 11/1981 | Bailey | 455/303 X |
| 4,951,013 | 8/1990 | DeCormier et al. | 333/156 X |
| 5,019,793 | 5/1991 | McNab | 333/139 X |
| 5,059,915 | 10/1991 | Grace et al. | 324/616 X |
| 5,357,224 | 10/1994 | Sterzer | 333/139 |

Primary Examiner—Robert Pascal
Assistant Examiner—Justin P. Bettendorf
Attorney, Agent, or Firm—Perman & Green, LLP

[57] ABSTRACT

A method and apparatus which realize an RF bandpass filter having a tunable bandwidth and center frequency over a large range of the radio frequency spectrum. The filter is comprised of a cascade of filter elements. Each element is comprised of a signal splitter which simultaneously feeds a signal to a delay line and a phase shifter in a parallel path. The delayed and phase shifted signals are summed. Each filter element exhibits periodic passbands and alternating transmission zeroes. Each successive filter element has a decreased delay by an incremental factor (e.g., typically 1.2), and exhibits an increase in the frequency intervals between stopband zeroes. The bandwidth is controlled by selecting a number of "activated" ones of the successive elements. A center frequency tuning is performed by adjusting a phase shift coefficient of at least one filter element. Such adjustments are performed by applying a test signal at each desired stopband zero frequency and adjusting the phase shift quantity of the element that is required to create the desired transmission zero. The residual power at the test frequency and transmission zero is measured at the filter output at the test signal frequency and the element's phase shifter is adjusted until a minimum output power is observed. Per the continuous sequential applications of the test signal at each of the stopband zero frequencies, and readjustments of each of the corresponding phase shifts, the filter parameters can be maintained as desired. The test sequencing and parameter controls are performed by digital computations.

25 Claims, 5 Drawing Sheets

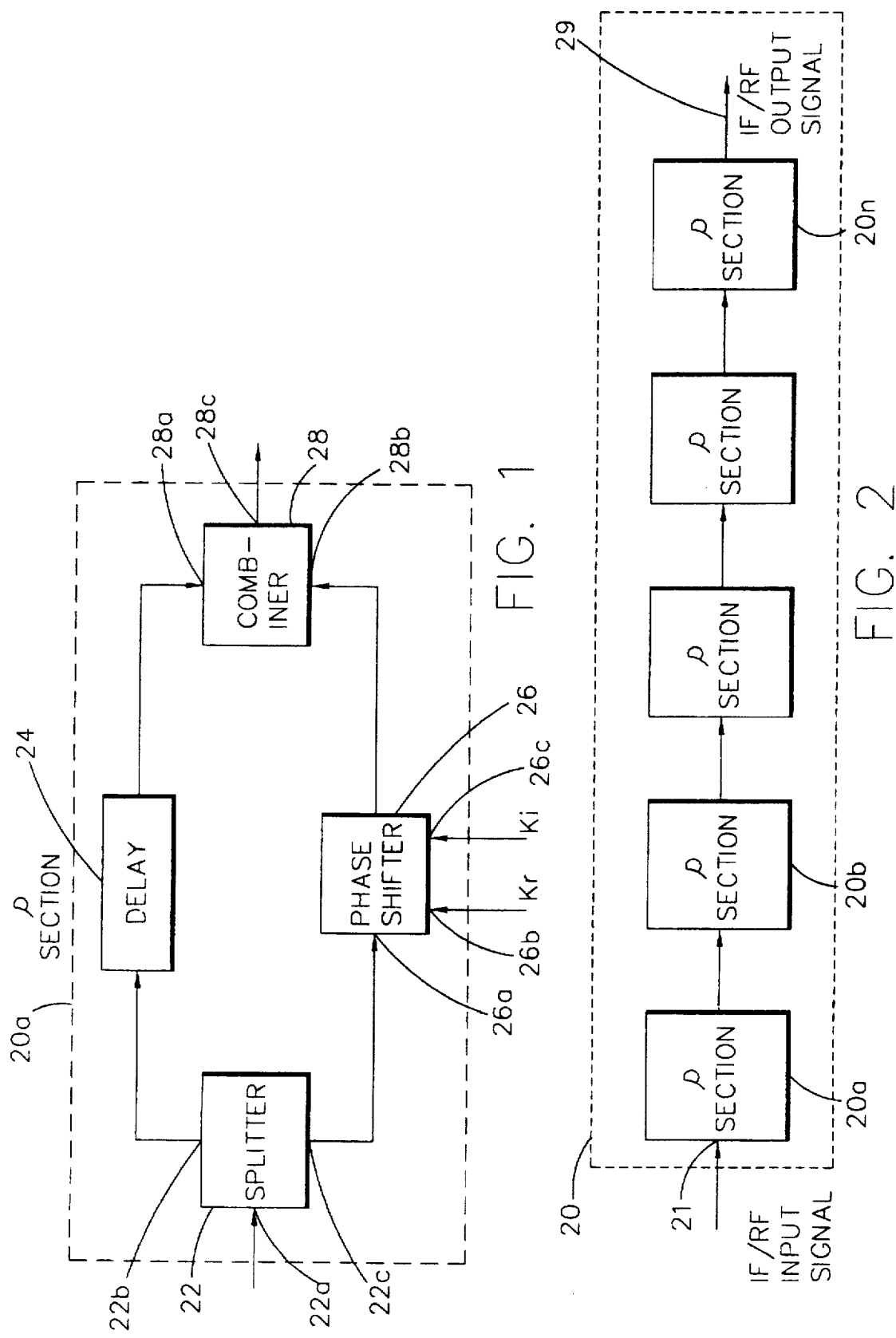

1

TUNABLE AND BANDWIDTH PROGRAMMABLE MULTI-ELEMENT FILTER SYSTEM

FIELD OF THE INVENTION

This invention relates generally to filters and, in particular, the invention relates to a tunable, bandwidth programmable multi-element transversal microwave filter system.

BACKGROUND OF THE INVENTION

Representative of the prior art that pertains to multi-element filters is U.S. Pat. No. 4,301,454, issued Nov. 17, 1981, entitled "Channelized Receiver System" by D. E. Bailey. This patent discloses the application of an RF signal to banks of filters, and a receiver which identifies the frequency channel in which an unknown signal is received.

The teaching of Bailey does not disclose a tunable and bandwidth programmable filter as does the present invention.

OBJECTS OF THE INVENTION

It is a first object of this invention to provide a programmable filter network, where network parameters can be programmably varied to adjust filtering bandwidths and tuning.

It is a second object of this invention to provide a programmable filter system that is of smaller size and less weight than traditional microwave filters having parameters similar to those of the filter system.

Further objects and advantages of this invention will become apparent from a consideration of the drawings and ensuing description.

SUMMARY OF THE INVENTION

The objects of the invention are realized by a method, and apparatus for accomplishing the method, for programmably adjusting the frequencies of stopband zeroes of a filter system.

The filter system is comprised of a plurality of serially-coupled individual filter sections, referred to herein as $\rho$ sections. Each individual $\rho$ section includes a delay element for delaying a signal by a predetermined amount to produce a delayed signal, a phase shifter for phase shifting the signal by an adjustable amount to produce an adjustably-phase shifted signal, and a combiner which sums the delayed and adjustably-phase shifted signals. For a first one of the plurality of serially-coupled $\rho$ sections which is coupled to a system input port, this process is performed on a generated test signal having a predetermined frequency of which a zero of the filter system is anticipated to be located. For every other $\rho$ section, the process is performed on a signal received from a preceding adjacent $\rho$ section. Each of the plurality of serially-coupled $\rho$ sections has a frequency response having passbands and stopband zeroes.

In a preferred embodiment of the invention, the delay element of each $\rho$ section has a characteristic delay that is smaller than that of a delay element of a preceding p section. As a consequence, in the preferred embodiment, the transmission zeroes exhibited by each $\rho$ section occur at wider intervals on the frequency spectrum than those exhibited by a preceding $\rho$ section. Similarly, the passbands exhibited by each $\rho$ section have wider bandwidths than those exhibited by a proceeding $\rho$ section. The composite frequency response of the filter system is the product of the frequency responses of each of the $\rho$ sections.

A tunable energy detector detects the magnitude of a signal (referred to herein as a "filtered signal") emanating from the plurality of $\rho$ sections in a narrow bandpass centered at the frequency of the test signal. The adjustable phase shift of one of the plurality of serially-coupled $\rho$ sections is remotely adjusted to minimize the magnitude of the filtered signal. The apparatus is similarly operated and adjusted for each of the other anticipated stopband zero locations. These adjustments locate the stopband zeroes of the filter apparatus to produce a minimum detected filtered test signal magnitude at generated test signal frequencies. The test signal can either be applied alone to the plurality of serially-coupled $\rho$ sections, or in combination with an operational RF signal. For either case, the adjustments made to the filter system minimize a magnitude of a filtered signal resulting from the application of the test signal to the filter system.

Successive $\rho$ sections of the filter have progressively smaller delays. Correspondingly, frequency intervals between transmission zeroes of the frequency responses of successive $\rho$ sections increase. For the case in which all $\rho$ sections are active, a narrowest bandwidth configuration is achieved. The bandwidth can be adjusted by "switching out" ("bypassing") certain $\rho$ sections. By example, by successively "switching out" individual $\rho$ sections having the longest delays of all the $\rho$ sections, the filter bandwidth can be increased by an amount equal to the inverse of the ratio of the delay of the "switched out" $\rho$ section and the delay of the next "active" $\rho$ section which follows the "switched out" $\rho$ section. In this manner, the selection of the delay increment determines the desired increment of the bandwidth adjustment, as well as the stopband attenuation. Individual $\rho$ sections can be "switched out" by causing the phase shift path through the $\rho$ section to be disconnected. A "switched out" $\rho$ section thereafter functions simply as a delay in the signal path and does not contribute to the filter bandshaping.

BRIEF DESCRIPTION OF THE DRAWINGS

The above set forth and other features of the invention are made more apparent in the ensuing Detailed Description of the Invention when read in conjunction with the attached Drawings, wherein:

FIG. 1 is a block diagram of an exemplary $\rho$ section.

FIG. 2 is a block diagram showing a plurality of the serially-coupled $\rho$ sections of FIG. 1.

DETAILED DESCRIPTION OF THE INVENTION

Figure 6:
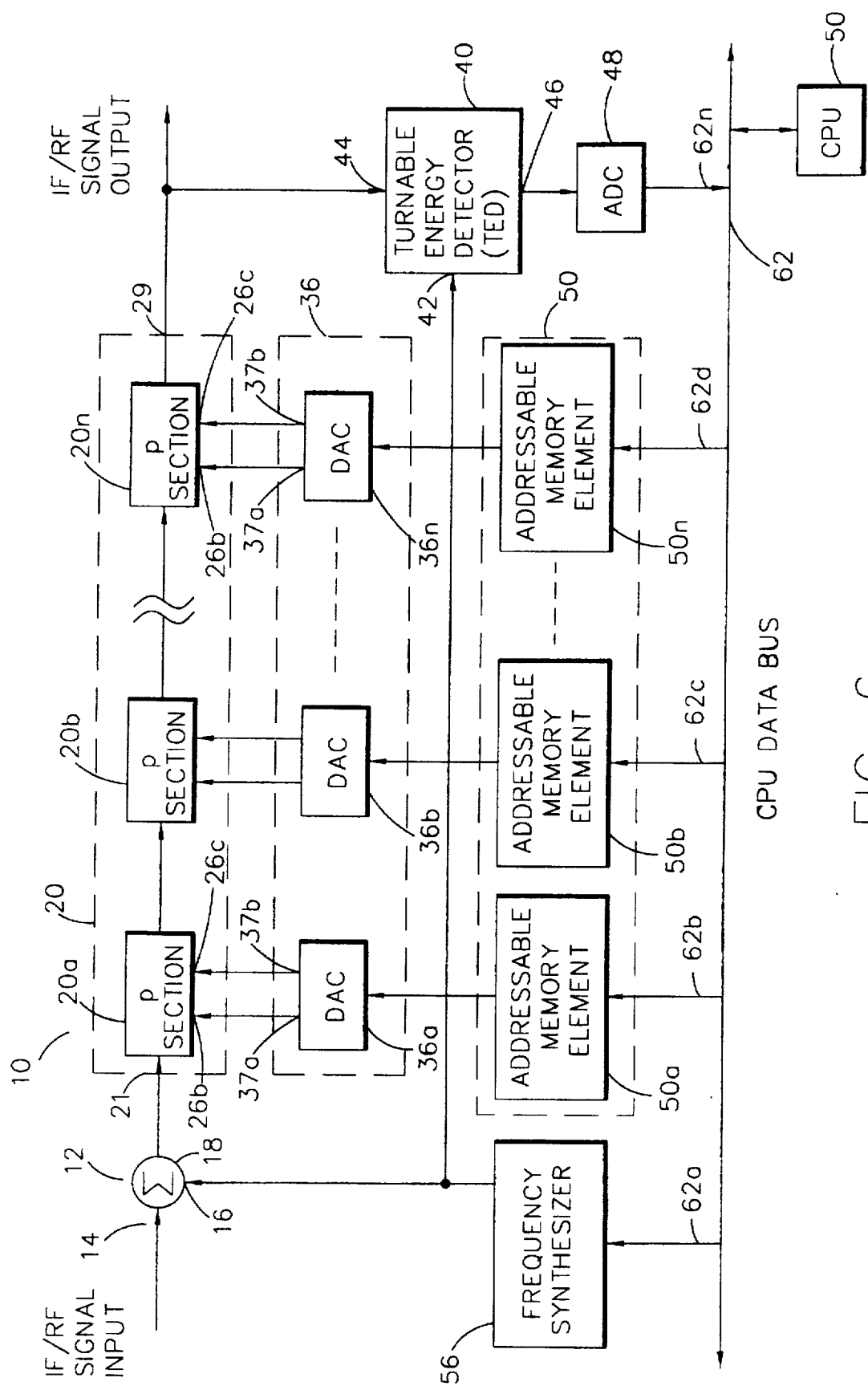
FIG. 6 is a block diagram of the tunable and bandwidth programmable multi-element filter system of this invention.

An example of a tunable and bandwidth programmable multi-element filter system 10 is shown in FIG. 6. In the preferred embodiment of this invention, the filter system 10 comprises a summer 12, a plurality of ρ sections 20, designated 20a ... 20n, a plurality of digital-to-analog converters (hereinafter "DACs") 36a ... 36n, a plurality of addressable memory elements 50a ... 50n, a tunable energy detector (hereinafter "TED") 40, a programmable frequency synthesizer 56, an analog-to-digital converter (hereinafter "ADC") 48, a computer processing unit (hereinafter "CPU") 60, and a CPU data bus 62. The CPU data bus 62 is coupled to the CPU via a connection terminal. The CPU data bus 62 has a plurality of connection terminals 62a .... 62n to which are coupled an input of the programmable frequency synthesizer 56, an input of each of the addressable memory elements 50a ... 50n, and an output of the ADC 48. The CPU data bus 62 functions as a pathway for signals routed between the CPU 60 and the frequency synthesizer 56, each of the addressable memory elements 50a ... 50n, and the ADC 48. The ADC 48 digitizes an output 46 of the TED 40 for inputting to the CPU 60.

The frequency synthesizer 56 has an output coupled to both a first input 42 of the TED 40, and to a first input 16 of the summer 12. The summer 12 has a second input 14 for receiving an RF input signal, typically an intermediate frequency (IF) signal, from a source such as a receiver. The summer 12 has an output 18 coupled to an input 21 of the plurality of ρ sections 20. The plurality of ρ sections 20 (see also FIG. 2) has an output 29 coupled to a second input 44 of the TED 40. Output 29 also provides a signal to further circuitry (not illustrated), the specifics of which are not germane to an understanding of this invention.

Figure 7:
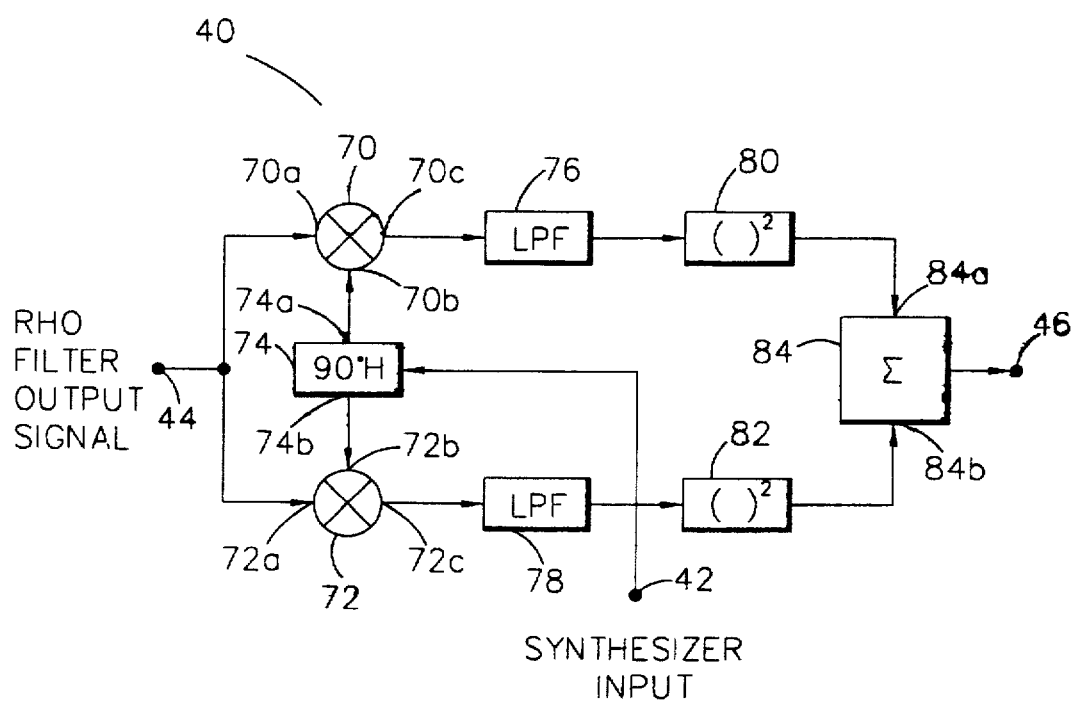
FIG. 7 is a block diagram of a tunable energy detector that forms a portion of the system of FIG. 6.

In the preferred embodiment, the TED 40 may be a conventional circuit for detecting a magnitude of RF power in a bandpass at a specified frequency, in a manner known to one skilled in the art. By example, and referring to FIG. 7, the TED 40 comprises a first mixer 70, a second mixer 72, a 90° hybrid coupler 74, a first lowpass filter 76, a second lowpass filter 78, a first squaring network 80, a second squaring network 82, and a summing network 84. The second input 44 of the TED 40 is coupled to a first input, 70a, 72a, of the first mixer 70 and the second mixer 72, respectively. An input of the 90° hybrid coupler 74 is connected to the first input 42 of the TED 40 and thus receives the output of the frequency synthesizer 56. A first output 74a of the 90° hybrid coupler 74 is coupled to a second input 70b of the first mixer 70. A second output 74b of the 90° hybrid coupler 74 is coupled to a second input 72b of the second mixer 72. The first mixer 70 has an output 70c coupled to an input of the first lowpass filter 76. Similarly, the second mixer 72 has an output 72c coupled to an input of the second lowpass filter 78. The first lowpass filter 76 has an output coupled to an input of the first squaring network 80. The second lowpass filter 78 has an output coupled to an input of the second squaring network 82. The first squaring network 80 has an output coupled to a first input 84a of the summing network 84. The second squaring network 82 has an output coupled to a second input 84b of the summing network 84. The summing network has an output connected to the output 46 of the TED 40, which in turn is coupled to the input of the ADC 48.

As shown in FIG. 2 and FIG. 6, the ρ sections 20a ... 20n are serially coupled together. In this manner, a signal entering the input 21 of the plurality of ρ sections 20 passes through each of the ρ sections 20a. ... 20n sequentially. Referring also to FIG. 1, each of the ρ sections 20a ... 20n comprises a splitter 22, a delay element (also referred to as a "fixed phase shift means") 24 having a characteristic time delay, a programmable phase shifter 26, and a combiner 28.

The splitter 22 has an input 22a, a first output 22b, and a second output 22c. The input 22a is for receiving a signal from some prior circuitry such as, for example, a preceding adjacent ρ section (i.e., ρ section 20a). The first output 22b of the splitter 22 is coupled to an input of the delay element 24. The second output 22c of the splitter 22 is coupled to a first input 26a of the programmable phase shifter 26. The splitter 22 may be a hybrid coupler or some other device which is capable of coupling a signal which is received by the applicable ρ section to the input of the delay element 24, and also to the input 26a of the programmable phase shifter 26.

The combiner 28 has a first input 28a coupled to an output of the delay element 24, and a second input 28b coupled to an output of the programmable phase shifter 26. An output 28c of the combiner 28 provides an output signal from the ρ section (i.e., ρ section 20a) to some further circuitry, such as a succeeding adjacent ρ section (i.e., ρ section 20b). The output 28c of the final ρ section 20n forms the filter output 29.

In the preferred embodiment, in each successive ρ section 20b ... 20n the delay element 24 has a characteristic time delay which is less than that of the adjacent, preceding ρ section. By example, the characteristic time delay of the delay element 24 of each successive ρ section 20b ... 20n is decreased from that of the preceding adjacent ρ section by a factor of 1.2.

Each of the addressable memory elements 50a ... 50n has an output coupled to an input of an individual one 36a ... 36n of the plurality of DACs 36. Each of the DACs 36a ... 36n has, respectively, a first output 37a and a second output 37b. The first output 37a of individual ones of the DACs 36a ... 36n is coupled to a second input 26b of an associated one of the programmable phase shifters 26. Likewise, the second output 37b of the DACs 36a ... 36n is coupled to a third input 26c of an associated one of the programmable shifters 26.

Within each ρ section (i.e., ρ section 20a) the signal is applied to the splitter 22, which simultaneously forwards the signal to the delay element 24 and to the programmable phase shifter 26. The delay element 24 delays the signal by a predetermined fixed amount to produce a first delayed signal. The phase shift of the delayed signal linearly increases with frequency relative to the phase of the signal input to the programmable phase shifter 26. The signal input to the programmable phase shifter 26 by the splitter 22 is phase shifted to control the frequencies at which the signals of the delayed and undelayed paths cancel, which thus produces a sequence of stopband zeroes, as will be described below. The amount of phase shift occurring in the programmable phase shifter 26 is adjustable, as will be described below, and depends upon coefficient values received by the programmable phase shifter 26 at its inputs 26b and 26c. The delayed signal and the phase shifted signal are combined in the combiner 28 to form the combined signal 28c. The phase shift versus frequency of the combined signal 28c is linear.

Figure 3:
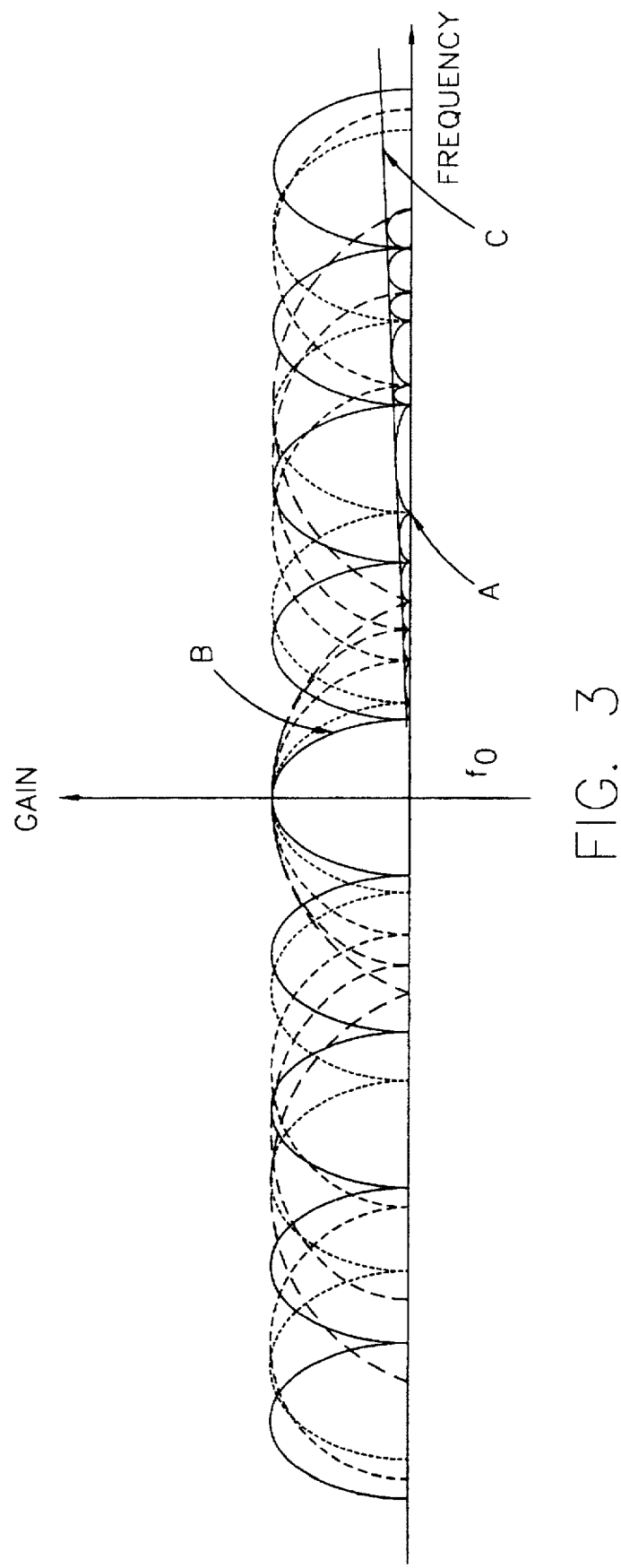
FIG. 3 is a graph showing the individual bandpass characteristics of each of the plurality of $\rho$ sections of FIG. 2.

FIG. 3 illustrates typical frequency response characteristics of individual ones of the ρ sections 20a ... 20n, and the composite frequency response characteristic (shown as a solid line) of all of the ρ sections 20a ... 20n. The composite frequency response characteristic is a function of the processing of the signal passing through all of the ρ sections 20. As shown in FIG. 3, the result is a frequency response characteristic having a large number of passbands and stopband zeros that are periodically distributed over the frequency spectrum. Referring to designation A in FIG. 3, each individual stopband zero of the composite frequency response characteristic has a frequency determined by a frequency of an individual stopband zero produced by one of the plurality of ρ sections. Referring to designation B in FIG. 3, the passband shape is approximately the shape of the narrowest "active" ρ section (see below for a discussion of "active" versus "bypassed" ρ sections). Referring to designation C in FIG. 3, the stopband response upper bound increases with increased offset from passband, since stopband zeroes occur at increasing interval widths.

Figure 4:
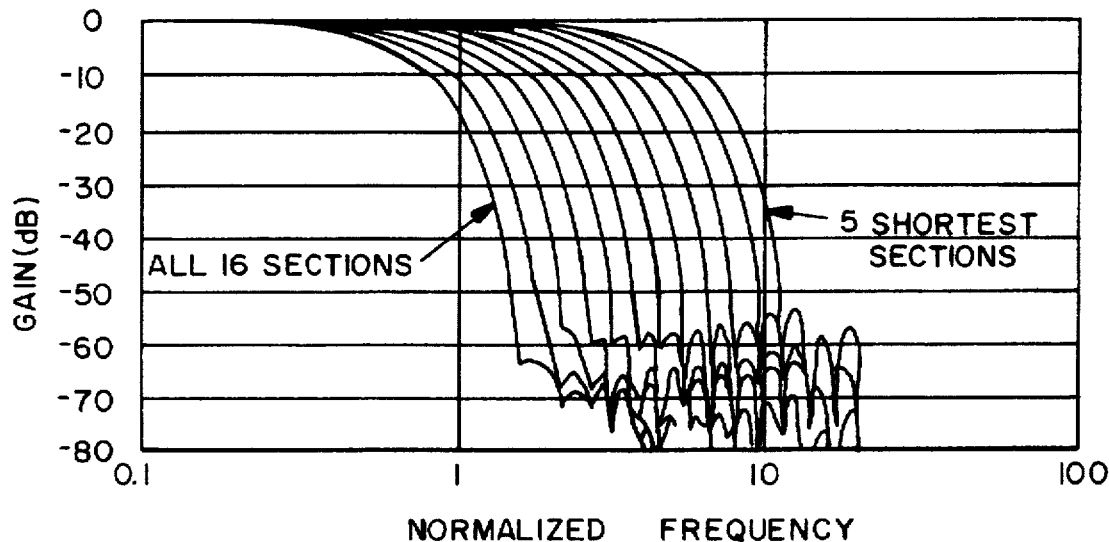
FIG. 4 illustrates graphs of the frequency responses of 5 to 16 of the serially-coupled $\rho$ sections of FIG. 1.
Figure 5:
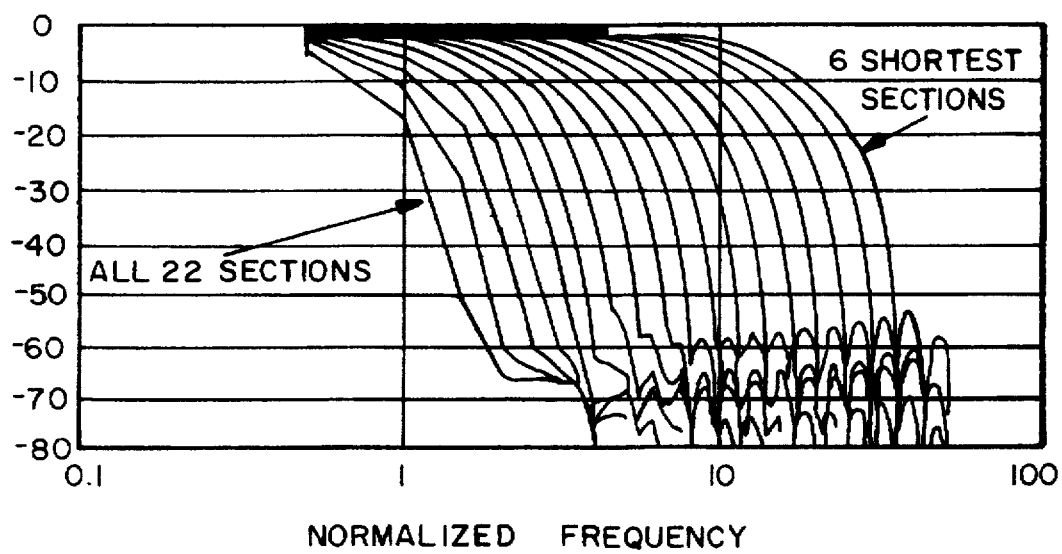
FIG. 5 illustrates graphs of the frequency responses of 5 to 22 of the serially-coupled $\rho$ sections of FIG. 1.

For purposes of description, FIG. 4 and FIG. 5 illustrate the frequency responses of a plurality of ρ sections 20, where the plurality comprises sixteen ρ sections and twenty-two ρ sections, respectively. The delay element 24 of each successive adjacent ρ section for both cases has a smaller characteristic time delay by a factor of 1.2. Thus, the bandwidth, or passband range, of a given ρ section is greater than that of a preceding, adjacent ρ section by a factor of 1.2. Referring to FIG. 4, the filter system 10 having sixteen ρ sections 20 is capable of achieving a stopband attenuation of at least 50 dB. As shown in FIG. 4, the stopband attenuation increases as the bandwidth is reduced. In order to maintain a desired passband range while increasing stopband attenuation, additional serially-coupled ρ sections may be added. The passband range for a filtering system 10 with sixteen ρ sections 20 is approximately 8:1. The phase versus frequency response of such a system 10 is linear. The filter system 10 having twenty-two ρ sections 20, having the frequency response characteristic illustrated in FIG. 5, is capable of achieving a bandwidth range of approximately 30:1, and a stopband attenuation of substantially greater than 50 dB.

In the preferred embodiment of this invention, there are at least five ρ sections 20. This amount assures that an undesired secondary passband response (an alias response) is distant enough in frequency from a desired passband response caused by the primary frequency input signal. As such, the desired primary filtered output signal does not merge with undesired secondary output signals to cause an undesired composite response characteristic. In another embodiment of this invention, suppression of undesired (alias) responses of secondary frequency signals may be accomplished by filtering out the secondary frequency signal with a conventional bandpass filter. A single conventional bandpass filter may serve to suppress the alias responses for a large variation of programmable bandpasses.

The filter system 10 has a wide range of center frequencies which can be actively controlled by the CPU 60, which causes adjustments to be made of the locations at which stopband zeros of the individual ρ sections 20a . . . 20n occur. A preferred adjustment causes the delayed and phase shifted signals to add in phase at a center frequency $f_o$, of the filter system 10, while adding out of phase, or cancelling, at the frequencies of the desired zero locations. The phase shift adjustments compensate for an incidental gain, phase shift, and/or loss which may occur to the signal that is being delayed by the delay element 24. When adjustments are made, the CPU 60 sends a command signal to the frequency synthesizer 56 over the CPU data bus 62. The signal emitted from the frequency synthesizer 56 has a frequency which is specified by the command received from the CPU 60. The frequency is programmed such that the test signal emitted by the frequency synthesizer 56 has a frequency which is anticipated to be the frequency at which a first zero is located above and closest to the center frequency $f_o$, at a desired stopband transmission zero location. In response to the received command, the frequency synthesizer 56 emits a test signal to both the summer 12 and the TED 40. The test signal may be summed with the incoming RF signal by the summer 12 to produce a summation signal. The summation signal is applied to the plurality of ρ sections 20. Note that the test signal can be applied whether or not an incoming RF signal is being received.

The summation signal passes through the plurality of ρ sections 20, as described above, and is emitted as a filtered signal, via output 29, to the TED 40.

Having received the test signal from the frequency synthesizer 56, and the filtered signal from output 29, the TED 40 determines the magnitude of the filtered signal at the frequency of the test signal, and reports the detected magnitude to the CPU 60 via the ADC 48 and CPU data bus 62. The TED bandwidth is small in comparison to the passband bandwidth of the filter system 10. As such, the principal signal component within the TED passband is the test signal. The filter system 10 may be adjusted as described above to minimize the magnitude of the signal.

The initial adjustment of the filter system 10 is done by having the CPU 60 address the addressable memory element 50n, which corresponds to the ρ section 20n having the shortest fixed delay element 24. The CPU 60 stores the values of Kr and Ki into the memory element 50n. The Kr and Ki values represent the real (r) and imaginary (i) parts, respectively, of a complex number. The values of Kr and Ki are initially set at the CPU 60 such that they satisfy the complex vector magnitude equation $\sqrt{(Kr)^2+(Ki)^2}=1$. The initial Kr and Ki values may be varied later to adjust the filter system 10, as will be described below. The digital output of the memory element 50n is then forwarded to and converted from digital to analog by the respective DAC 36n. The DAC 36n outputs an analog signal representing the Kr value via first output 37a to the second input 26b of the programmable phase shifter 26. The DAC 36n also outputs an analog signal representing the Ki value via its second output 37b to the third input 26c of the programmable phase shifter 26. Based upon the signals received from the DAC 36n, the programmable phase shifter 26 adjusts the passband center frequency of the ρ section 20n associated with the programmable phase shifter 26.

Figure 8:
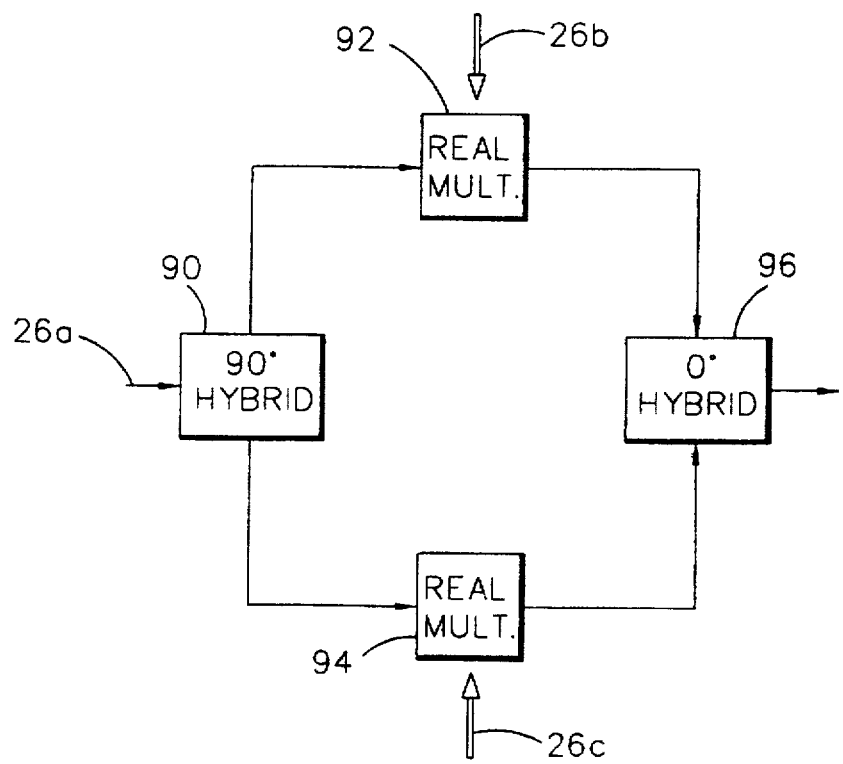
FIG. 8 is a block diagram illustrating a preferred embodiment of a phase shifter constructed in accordance with this invention.

In a preferred embodiment of this invention, the phase shifting occurring in the phase shifter 26 is performed as follows. Referring to FIG. 6 and FIG. 8, a signal (also designated as an "unmultiplied signal") that is applied to the programmable phase shifter input 26a is forwarded, via a 90° hybrid coupler 90, to a first and a second real multiplier, 92, 94, respectively. The first real multiplier 92 has an input which forms the second input 26b of the programmable phase shifter 26 for receiving the analog Kr value signal from the output 37a of the respective DAC 36n. The second real multiplier 94 has an input which forms the third input 26c of the programmable phase shifter 26 for receiving the analog Ki value signal from the output 37b of the respective DAC 36n. The first and second real multipliers 92, 94 multiply the signal by the analog values of Kr and Ki, respectively, and the results are added together via a 0° hybrid coupler 96 and output as a phase shifted signal from the programmable phase shifter 26. The amount of phase shift exhibited by the phase shifted signal is represented by the quantity $\phi$, which itself is represented by the equation $\phi=\arctan(Ki/Kr)$. The phase shifted signal may exhibit a gain or loss with respect to the unmultiplied signal. Such a discrepancy may be compensated for by adjusting the values of Kr and Ki at the CPU 60 until the discrepancy is minimized. It should be noted that in this case, it is no longer necessary to maintain the Kr and Ki values such that they satisfy the complex magnitude equation $\sqrt{(Kr)^2+(Ki)^2}=1$. Indeed, as the Kr and Ki values are adjusted from their initial values, the value of $\sqrt{(Kr)^2+(Ki)^2}$ will correspondingly vary, and will no longer be equal to 1. The Kr and Ki values may be continually varied by small increments to minimize the output of the TED 40.

A correct adjustment of the filter system 10 is achieved by minimizing a magnitude of a signal emanating from the system 10 in response to the application of a test signal having a frequency equal to that of any one of the stopband zeroes of the system 10. By example, the CPU 60 drives the frequency synthesizer 56 to output a signal having a frequency which is equal to the frequency of which the second transmission zero is required to occur above the center frequency $f_o$. The test signal may be summed with the incoming RF signal at the summer 12 to produce the summation signal which passes through the plurality of serially coupled ρ sections 20 in a manner as described above. The TED 40 detects the magnitude of the signal output from the ρ sections 20 and reports the detected magnitude to the CPU 60. If the detected magnitude exceeds a predetermined minimum value, the CPU 60 addresses the addressable memory element 50n−1 corresponding to the ρ section 20n−1 having the next shortest delay element, thereby programming the associated phase shifter 26 as described above. This phase shifter's constants Kr and Ki are varied until a magnitude of the output signal detected by the TED 40 is less than or equal to the predetermined minimum value. This adjustment setting is verified by reprogramming the frequency synthesizer 56 to output a signal having a frequency equal to the frequency of the second zero above or below the center frequency $f_o$. A correct adjustment setting is indicated by the TED 40 detecting a magnitude of an output signal which does not exceed the predetermined minimum value (e.g., substantially zero) at this frequency.

Each of the other ρ section zero locations, beginning with the ρ section 20n−2 having the next smallest delay element, is adjusted in a manner similar to that described above to align the filter system 10. Proper adjustment enables a signal to be filtered by the filter system 10 so as to exhibit a minimum frequency response at the frequency locations of the desired stopband zeroes. Also, it should be noted that adjustments can be made actively (i.e., while receiving an RF signal at input 14 of summer 12) with minimal impact on received RF signals passing through the filter system 10. When properly adjusted, the filter system 10 suppresses test signals emitted by the frequency synthesizer 56 to a magnitude approximating that of residual circuit noise. Thus, the simultaneous application of a test signal has minimal impact on the filtered RF signals.

Once the filter system 10 has been aligned as described above, the passband bandwidths exhibited by the system 10 may be adjusted. As discussed above, the delay element 24 of each successive adjacent ρ section has a smaller characteristic time delay. Also, the passband bandwidth of a given ρ section is greater than that of a preceding ρ section. The system 10 passband bandwidths, which are a function of the processing of a signal passing through all of the ρ sections 20, may be adjusted in the following manner. In an application where it is desired to maximize the passband bandwidths of the system 10, the ρ sections having relatively smaller passband bandwidths may be effectively "bypassed" ("switched out") to achieve the desired passband bandwidths. This may be accomplished by having the CPU 60 address the addressable memory elements (e.g., addressable 50a . . . 50d) which correspond to the respective ρ sections (e.g., ρ sections 20a . . . 20d) having the smallest passband bandwidths (and delay elements 24 with the largest characteristic time delays) of all of the ρ sections 20a . . . 20n of the filter system 10. In the same manner as described above for the initial adjustment of the filter system 10, the CPU 60 stores the values of Kr and Ki into the respective addressable memory elements 50a . . . 50d, and these values are sent to the phase shifters 26 of the respective ρ sections 20a . . . 20n via respective the DACs 36a . . . 36d. In this case, however, the Kr and Ki values are set at the CPU 60 such that they conform to the complex vector magnitude equation $\sqrt{(Kr)^2+(Ki)^2}=0$. In this manner, a signal passing through the phase shifter 26 ("delay line") of one of the ρ sections 20a . . . 20d is effectively multiplied by zero while passing through the delay line of the applicable ρ section. Thus, the signal's resultant magnitude after passing through the phase shifter 26 is substantially equal to zero. The signal passing through the delay element 24 of the respective one of the ρ sections 20a . . . 20d is, however, delayed by a predetermined amount, as described above, and forwarded to the combiner 28. As such, a signal emanating from a respective one of the ρ sections 20a . . . 20d is, in effect, simply a delayed version of the signal which was applied to the splitter 22 of the ρ section. In this manner, the ρ sections 20a . . . 20d having the smallest passband bandwidths are effectively "bypassed", and do not exhibit stopband zeroes.

The Kr and Ki values that are sent to the respective phase shifters 24 of each of the other ρ sections 20e . . . 20n are set, in a manner similar to that described earlier, such that $\sqrt{(Kr)^2+(Ki)^2}$ substantially equals 1. As such, ρ sections 20e . . . 20n exhibit stopband zeroes, unlike "bypassed" ρ sections 20a . . . 20d. As a result, the passband bandwidths exhibited by the filter system 10 are mainly a function of these "active" ρ sections 20e . . . 20n. Other ρ sections having relatively small passband bandwidths may be "bypassed" in the same manner as described above in applications where it is desired that the filter system 10 exhibit even larger passband bandwidths. As such, the number of ρ sections that are "bypassed" in a particular application depends upon the passband bandwidths desired to be exhibited by the filter system 10. By successively "bypassing" individual ρ sections having the longest delays of all the ρ sections, the filter bandwidth can be increased by an amount equal to the inverse of the ratio of the delay of the "bypassed" ρ section and the delay of the next "active" ρ section which follows the "bypassed" ρ section. The filter system 10 exhibits its largest passband bandwidth when ρ sections 20a . . . 20n−1 are effectively "bypassed", and the ρ section 20n which has the largest passband bandwidth of all the ρ sections 20a . . . 20n is not "bypassed".

In applications where it is desired that the filter system 10 exhibit relatively smaller passband bandwidths, a process similar to that described above may be performed, but to incorporate those ρ sections having larger delay elements 24 and correspondingly smaller bandwidths. Thus, as the passband bandwidth of the filter system 10 is narrowed, the system 10 may be comprised of correspondingly more ρ sections until the narrowest programmable bandwidth is achieved which incorporates all ρ sections 20a . . . 20n.

While the invention has been particularly shown and described with respect to preferred embodiments thereof, it will be understood by those skilled in the art that changes in form and details may be made therein without departing from the scope and spirit of the invention.

What is claimed is:

1. A method for locating stopband transmission zeroes exhibited by a filter system at desired locations on a frequency spectrum, comprising the steps of:

applying a test signal having a predetermined frequency to an input port of a plurality of serially-coupled filter elements, each of the plurality of filter elements having associated stopband transmission zeroes of adjustable frequencies, an input of a first one of the plurality of filtering elements being coupled to the input port;

detecting a magnitude of a signal that is output from a last one of the plurality of filter elements, wherein the output signal exhibits transmission stopband zeroes having frequencies that are a function of the frequencies of the transmission stopband zeroes of each of the plurality of filter elements; and recursively adjusting the frequencies of the stopband transmission zeroes associated with at least one of the plurality of filter elements to minimize a magnitude of a signal that is output from the last one of the plurality of filter elements at the frequency of the test signal.

2. A method as set forth in claim 1, wherein each of the plurality of filter elements has an input and an output, further comprising the steps of:

delaying within each one of the plurality of filter elements a signal received at the input by a fixed amount to produce a delayed signal, phase shifting the signal received at the input by an adjustable amount to produce an adjustably-phase shifted signal, combining the delayed and adjustably-phase shifted signals, and supplying a combined signal to the output.

3. A method as set forth in claim 2, wherein in each of the plurality of filter elements the amount of fixed delay is a function of, and differs from, the amount of fixed delay of others of said plurality of filter elements.

4. A method as set forth in claim 2, wherein the frequencies of the stopband transmission zeroes associated with each filter element are a function of the amount of adjustable phase shift of the filtering element.

5. A method as set forth in claim 4, wherein the step of recursively adjusting varies the adjustable phase shift of at least one of the plurality of filter elements.

6. A method as set forth in claim 2, wherein the step of phase shifting the signal by an adjustable amount is accomplished by multiplying the signal by at least one complex coefficient having a magnitude nominally equal to one.

7. A method as set forth in claim 1, wherein the plurality of filter elements comprise at least five filter elements.

8. A method as set forth in claim 1, wherein the step of applying is performed by:

summing the test signal with a received RF signal to produce a summation signal; and applying the summation signal to the input port of the plurality of filtering elements.

9. A method for tuning a bandpass filter exhibiting a plurality of stopband transmission zeroes for RF energy within a band of frequencies, comprising the steps of:

applying a received RF signal to an input port of a plurality of serially-coupled filter elements, each of the plurality of filter elements having an input and an output, the input of a first one of the plurality of filter elements being coupled to the input port;

time delaying within each one of the plurality of filter elements a signal received at the input by a fixed amount to produce a delayed signal, phase shifting the signal received at the input by an adjustable amount to produce an adjustably-phase shifted signal, combining the delayed and adjustably-phase shifted signals, and supplying a combined signal to the output; and outputting from a last one of the plurality of filter elements a minimum RF signal energy at a predetermined frequency, which RF signal energy is a function of an amount by which a signal is adjustably phase shifted within at least one filter element; wherein the step of time delaying performed within each of the plurality of filter elements delays a signal received at the input by an amount of fixed delay that is a function of, and differs from, the amount of fixed delay of others of said plurality of filter elements.

10. A method as set forth in claim 9, wherein within each of the plurality of filter elements the amount of fixed delay differs from the amount of fixed delay of each of the other ones of said plurality of filter elements by a fixed ratio.

11. A method for adjusting the bandwidth of at least one passband of a filter system, comprising the steps of:

applying a received RF signal to an input port of a plurality of serially-coupled $\rho$ sections, each of the plurality of $\rho$ sections having an input, an output, and a characteristic delay value that differs from that of others of the plurality of $\rho$ sections, the input of a first one of the plurality of $\rho$ sections being coupled to the input port, each of the plurality of $\rho$ sections being controllable to perform either a first operation or a second operation, a signal being output from a last one of the plurality of $\rho$ sections exhibiting at least one passband of the filter system; and controlling at least one of the plurality of $\rho$ sections to perform either the first operation or the second operation until the at least one passband of the filter system has a desired bandwidth and center frequency; wherein to perform the first operation, a $\rho$ section chase shifts a signal received at the input by a fixed phase shift amount and supplies a resultant first phase shifted signal to the output, and to perform the second operation, the $\rho$ section phase shifts the signal received at the input by an amount that is a combination of the fixed phase shift amount and a variable phase shift amount, and supplies a resultant second phase shifted signal to the output.

12. A method for adjusting the bandwidth of at least one passband of a filter system, comprising the steps of:

applying a received RF signal to an input port of a plurality of serially-coupled $\rho$ sections, each of the plurality of $\rho$ sections having an input, an output, and a characteristic delay value that differs from that of others of the plurality of $\rho$ sections, the input of a first one of the plurality of $\rho$ sections being coupled to the input port, each of the plurality of $\rho$ sections being controllable to perform either a first operation or a second operation, a signal being output from a last one of the plurality of $\rho$ sections exhibits at least one passband of the filter system; and controlling at least one of the plurality of $\rho$ sections to perform either the first operation or the second operation until the at least one passband of the filter system has a desired bandwidth and center frequency; wherein to perform the first operation, a $\rho$ section forwards a signal received at the input to the output, and to perform the second operation, the $\rho$ section filters the signal received at the input and supplies a filtered signal to the output, wherein the step of forwarding performed by the $\rho$ section during the first operation includes the steps of:

delaying the signal received at the input by a fixed amount to produce a delayed signal; and multiplying the signal received at the input by a multiplication vector magnitude to produce a multiplied signal having a substantially zero amplitude;

combining the delayed and multiplied signals to provide a combination signal to the output.

13. A method for adjusting the bandwidth of at least one passband of a filter system, comprising the steps of:

applying a received RF signal to an input port of a plurality of serially-coupled ρ sections, each of the plurality of ρ sections having an input, an output, and a characteristic delay value that differs from that of others of the plurality of ρ sections, the input of a first one of the plurality of ρ sections being coupled to the input port, each of the plurality of ρ sections being controllable to perform either a first operation or a second operation, a signal being output from a last one of the plurality of ρ sections exhibits at least one passband of the filter system; and controlling at least one of the plurality of ρ sections to perform either the first operation or the second operation until the at least one passband of the filter system has a desired bandwidth and center frequency; wherein to perform the first operation, a ρ section forwards a signal received at the input to the output, and to perform the second operation, the ρ section filters the signal received at the input and supplies a filtered signal to the output, wherein the steps of filtering and supplying performed by the ρ section during the second operation include the steps of:

delaying the signal received at the input by a fixed amount to produce a delayed signal;

multiplying the signal received at the input by a programmable multiplication vector magnitude to produce a multiplied signal exhibiting a phase shift; and combining the delayed and multiplied signals to provide a filtered signal to the output, wherein the filtered signal exhibits at least one passband bandwidth that is a function of the programmable multiplication vector magnitude.

14. A tunable bandpass filter exhibiting a plurality of stopband zeroes for RF energy within a band of frequencies, comprising:

an input port for receiving an RF signal to be filtered;

an output port for outputting a filtered RF signal;

a plurality of serially-coupled filtering means interposed between said input port and said output port, each of said plurality of filtering means having an input and an output, an input of a first one of said plurality of filtering means being coupled to said input port, each of said plurality of filtering means comprising:

fixed phase shift means;

programmable variable phase shift means;

splitter means coupled to said input and providing a first output and a second output, said first output being coupled to said fixed phase shift means and said second output being coupled to said programmable variable phase shift means;

means for combining an output of said fixed phase shift means with an output of said programmable variable phase shift means, said combining means of a last one of said plurality of filtering means being coupled to said output port and providing a minimum RF signal energy at a predetermined frequency to said output port, which minimum RF signal energy is a function of a phase shift within said programmable variable phase shift means; wherein in each of said plurality of filtering means said fixed phase shift means has a predetermined phase shift that is a function of, and that differs from, the predetermined phase shift of the fixed phase shift means of other ones of said plurality of filtering means.

15. A tunable filter as set forth in claim 14 wherein the programmable variable phase shift means is a programmable multiplying means.

16. A tunable filter as set forth in claim 14, wherein said fixed phase shift means of each of said plurality of filtering means has a predetermined phase shift that differs by a constant amount from the predetermined phase shift of the fixed phase shift means of each of the other ones of said plurality of filtering means.

17. A tunable filter exhibiting a plurality of stopband zeroes for RF energy within a band of frequencies, comprising:

an input port for receiving an RF signal to be filtered;

an output port for outputting a filtered RF signal;

a plurality of serially-coupled filtering means interposed between said input port and said output port, each of said plurality of filtering means having an input and an output, an input of a first one of said plurality of filtering means being coupled to said input port, each of said plurality of filtering means comprising:

fixed phase shift means;

programmable variable phase shift means;

splitter means coupled to said input and providing a first output and a second output, said first output being coupled to said fixed phase shift means and said second output being coupled to said programmable variable phase shift means;

means for combining an output of said fixed phase shift means with an output of said programmable variable phase shift means, said combining means of a last one of said plurality of filtering means being coupled to said output port and providing a minimum RF signal energy at a predetermined frequency to said output port, which minimum RF signal energy is a function of a phase shift within said programmable variable phase shift means; wherein in each of said plurality of filtering means said fixed phase shift means has a predetermined phase shift that is a function of, and that differs from, the predetermined phase shift of the fixed phase shift means of other ones of said plurality of filtering means, and wherein said tunable filter further comprises:

programmable frequency generation means, for generating a test signal at a predetermined frequency;

means for summing said test signal with said received RF signal and providing a summation signal to said input port;

means for detecting an amount of RF signal energy that is emitted from said output port; and means for recursively programming said programmable variable phase shift means of at least one of said plurality of filtering means to minimize the RF signal energy at said test signal frequency that is emitted from said output port.

18. A tunable filter exhibiting a plurality of stopband zeroes for RF energy within a band of frequencies, comprising:

an input port for receiving an RF signal to be filtered;

an output port for outputting a filtered RF signal;

a plurality of serially-coupled filtering means interposed between said input port and said output port, each of said plurality of filtering means having an input and an output, an input of a first one of said plurality of filtering means being coupled to said input port, each of said plurality of filtering means comprising:

fixed phase shift means;

programmable variable phase shift means;

splitter means coupled to said input and providing a first output and a second output, said first output being coupled to said fixed phase shift means and said second output being coupled to said programmable variable phase shift means;

means for combining an output of said fixed phase shift means with an output of said programmable variable phase shift means, said combining means of a last one of said plurality of filtering means being coupled to said output port and providing a minimum RF signal energy at a predetermined frequency to said output port, which minimum RF signal energy is a function of a phase shift within said programmable variable phase shift means; wherein in each of said plurality of filtering means said fixed phase shift means has a predetermined phase shift that is a function of, and that differs from, the predetermined phase shift of the fixed phase shift means of other ones of said plurality of filtering means, and wherein said tunable filter further comprises:

means for detecting an amount of RF signal energy that is emitted from said output port; and means for recursively programming said programmable variable phase shift means of at least one of the plurality of filtering means to minimize the RF signal energy emitted from said output port at a predetermined frequency. means.

19. A tunable filter exhibiting a plurality of stopband zeroes for RF energy within a band of frequencies, comprising:

an input port for receiving an RF signal to be filtered;

an output port for outputting a filtered RF signal;

a plurality of serially-coupled filtering means interposed between said input port and said output port, each of said plurality of filtering means having an input and an output, an input of a first one of said plurality of filtering means being coupled to said input port, each of said plurality of filtering means comprising:

fixed phase shift means;

programmable variable phase shift means;

splitter means coupled to said input and providing a first output and a second output, said first output being coupled to said fixed phase shift means and said second output being coupled to said programmable variable phase shift means;

means for combining an output of said fixed phase shift means with an output of said programmable variable phase shift means, said combining means of a last one of said plurality of filtering means being coupled to said output port and providing a minimum RF signal energy at a predetermined frequency to said output port, which minimum RF signal energy is a function of a phase shift within said programmable variable phase shift means; wherein in each of said plurality of filtering means said fixed phase shift means has a predetermined phase shift that is a function of, and that differs from, the predetermined phase shift of the fixed phase shift means of other ones of said plurality of filtering means, and wherein the plurality of filtering means comprise at least five filtering means.

20. An RF bandpass filter having a tunable bandwidth and center frequency, said bandpass filter comprising a cascade of individual filter elements, each filter element comprising a signal splitter which simultaneously feeds a signal to a delay line and to an adjustable phase shifter in parallel with said delay line, and means for summing the delayed and phase shifted signals; each filter element exhibiting periodic passbands and alternating transmission zeroes, and each successive filter element of said cascade of filter elements having a decreased delay in said delay line from a preceding filter element and exhibiting an increase in the frequency intervals between stopband zeroes.

21. An RF bandpass filter as set forth in claim 20, and further comprising means for controlling the bandwidth of said passband filter by selecting a number of activated ones of the successive filter elements.

22. An RF bandpass filter as set forth in claim 20, and further comprising means for tuning a center frequency of said filter, said tuning means comprising means for adjusting a phase shift coefficient of at least one filter element.

23. An RF bandpass filter having a tunable bandwidth and center frequency, said bandpass filter comprising a cascade of individual filter elements, each filter element comprising a signal splitter which simultaneously feeds a signal to a delay line and to an adjustable phase shifter in parallel with said delay line, and means for summing the delayed and phase shifted signals; each filter element exhibiting periodic passbands and alternating transmission zeroes, and each successive filter element of said cascade of filter elements having a decreased delay in said delay line from a preceding filter element and exhibiting an increase in the frequency intervals between stopband zeroes; wherein said RF bandpass filter further comprises means for tuning a center frequency of said filter, said tuning means comprising means for adjusting a phase shift coefficient of at least one filter element; wherein said adjusting means is comprised of: means for applying a test signal at each desired stopband zero frequency; and means for controllably adjusting the phase shift quantity of a filter element that is required to create a desired one of the transmission zeroes.

24. An RF bandpass filter as set forth in claim 23, wherein said controllably adjusting means is comprised of: means for measuring a residual power at the test frequency and transmission zero at an output of said bandpass filter; and wherein said controllably adjusting means adjusts at least one of a frequency of the test signal and the filter element's phase shifter until a minimum output power is observed at the output of said bandpass filter.

25. An RF bandpass filter as set forth in claim 23, wherein said controllably adjusting means is comprised of: means for measuring a residual power at the test frequency and transmission zero at an output of said bandpass filter; and wherein said controllably adjusting means recursively applies the test signal at a plurality of said stopband zero frequencies, and readjusts a phase shift of a corresponding filter element's phase shifter until a minimal residual power at the test frequency is measured at said output of said bandpass filter.

* * * * *